United States Patent
Li

(10) Patent No.: US 9,742,407 B2
(45) Date of Patent: Aug. 22, 2017

(54) CIRCUIT AND METHOD FOR SHIFTING VOLTAGE LEVEL

(71) Applicant: TAIWAN SEMICONDUCTOR MANUFACTURING CO., LTD., Hsinchu (TW)

(72) Inventor: Ming-Liang Li, Zhejiang Province (CN)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/071,900

(22) Filed: Mar. 16, 2016

(65) Prior Publication Data
US 2017/0134027 A1    May 11, 2017

(30) Foreign Application Priority Data
Nov. 10, 2015 (CN) .......................... 2015 1 0760501

(51) Int. Cl.
*H03K 5/00* (2006.01)
*H03K 19/0185* (2006.01)

(52) U.S. Cl.
CPC ........................... *H03K 19/018521* (2013.01)

(58) Field of Classification Search
CPC ........... H03K 3/356; H03K 19/018521; H03K 19/00315; H03K 17/102; H03K 3/012
USPC ................. 327/306, 333; 326/60–61, 81–82; 328/60–61, 81–82
See application file for complete search history.

(56) References Cited

U.S. PATENT DOCUMENTS

| | | | | |
|---|---|---|---|---|
| 6,066,975 A * | 5/2000 | Matano | ................ | H03K 17/102 326/62 |
| 6,087,880 A * | 7/2000 | Takagi | ............. | H03K 3/356113 326/63 |
| 6,756,813 B2 * | 6/2004 | Harada | ..................... | G11C 8/08 326/121 |
| 7,400,171 B1 * | 7/2008 | Montazer | ......... | H03K 3/356113 326/68 |

* cited by examiner

*Primary Examiner* — Dinh T Le
(74) *Attorney, Agent, or Firm* — Maschoff Brennan

(57) ABSTRACT

A circuit is disclosed that includes a first switch unit, a first level shift unit and a second level shift unit. The first switch unit is configured to receive a first dynamic input voltage, and to generate a first operation voltage at a first operation terminal or generate a second operation voltage at a second operation terminal according to the first dynamic input voltage. The first level shift unit is coupled to the first switch unit at the first operation terminal, and is configured to shift the first operation voltage to a first output voltage having a first level at an output terminal according to a first supply voltage. The second level shift unit is coupled to the first switch unit at the second operation terminal, and is configured to shift the second operation voltage to the first output voltage having a second level according to a second supply voltage.

20 Claims, 6 Drawing Sheets

CIRCUIT AND METHOD FOR SHIFTING VOLTAGE LEVEL

RELATED APPLICATIONS

This application claims priority to Chinese Application Serial Number 201510760501.4, filed Nov. 10, 2015, which is herein incorporated by reference.

BACKGROUND

There are many devices or modules in integrated circuits (ICs). These devices or modules are configured to execute different tasks for achieving specific functions. These devices or modules often need voltage sources with different voltage to execute corresponding tasks. Consequently, a level shift circuit is implemented in various ICs to perform voltage level shifting.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
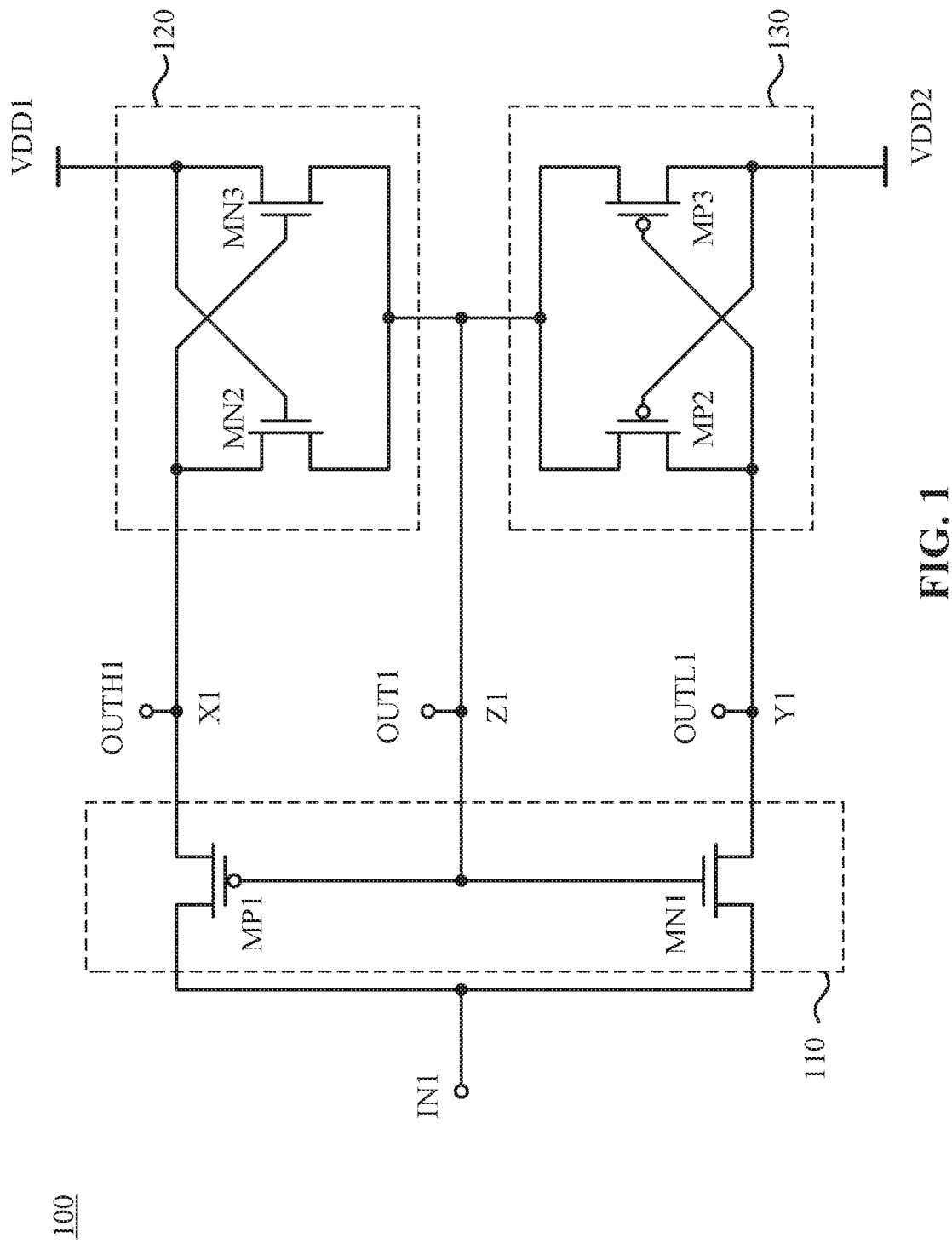
FIG. 1 is a circuit diagram of a circuit, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Secondly, the terms "comprise," "comprising," "include," "including," "has," "having," etc. used in this specification are open-ended and mean "comprises but not limited".

FIG. 1 is a circuit diagram of a circuit 100, in accordance with various embodiments of the present disclosure. In some embodiments, the circuit 100 is a level shift circuit, or applied in a level shift circuit.

As illustratively shown in FIG. 1, the circuit 100 includes a switch unit 110, a level shift unit 120 and a level shift unit 130.

The switch unit 110 is configured to receive a dynamic input voltage IN1 and to generate a corresponding operation voltage according to the dynamic input voltage IN1. As illustratively shown in FIG. 1, the switch unit 110 generates an operation voltage OUTH1 at an operation terminal X1 or generates an operation voltage OUTL1 at an operation terminal Y1 according to a voltage level of the dynamic input voltage IN1.

The level shift unit 120 is coupled to the switch unit 110 at the operation terminal X1. The level shift unit 120 is configured to shift the operation voltage OUTH1 at the operation terminal X1 to an output voltage OUT1 according to a supply voltage VDD1. The output voltage OUT1 has a first level and is outputted at an output terminal Z1.

The level shift unit 130 is coupled to the switch unit 110 at the operation terminal Y1. The level shift unit 130 is configured to shift the operation voltage OUTL1 at the operation terminal Y1 to an output voltage OUT1 according to a supply voltage VDD2. The output voltage OUT1 has a second level and is outputted at the output terminal Z1.

In some embodiments, the switch unit 110 includes a switch MP1 and a switch MN1. The switch MP1 is configured to be turned on in a state where the dynamic input voltage IN1 has a first level, so as to transmit the dynamic input voltage IN1 having the first level as the operation voltage OUTH1. The switch MN1 is configured to be turned on in a state where the dynamic input voltage IN1 has a second level, so as to transmit the dynamic input voltage IN1 having the second level as the operation voltage OUTL1.

In some embodiments, the switch MP1 is implemented with a P-type metal-oxide-silicon filed-effect transistor (PMOS). The switch MN1 is implemented with a N-type metal-oxide-silicon filed-effect transistor (NMOS). The PMOS is complementary to the NMOS. As illustratively shown in FIG. 1, the switch MP1 has a source configured to receive the dynamic input voltage IN1, a gate coupled to the output terminal Z1, and a drain coupled to the operation terminal X1. The switch MN1 has a source configured to receive the dynamic input voltage IN1, a gate coupled to the output terminal Z1, and a drain coupled to the operation terminal Y1. The gates of the switch MP1 and MN1 are coupled to the output terminal Z1.

The configurations of the switches MP1 and MN1 in the aforementioned embodiments are given for illustrative purposes only. Various elements configured to implement the switches MP1 and MN1 are within the contemplated scope of the present disclosure.

Moreover, the configurations of the switch unit 110 in the aforementioned embodiments are given for illustrative purposes only. Various configurations configured to implement the switch unit 110 are within the contemplated scope of the present disclosure. For example, in other embodiments, the switch unit 110 includes more than two switches.

In some embodiments, as illustratively shown in FIG. 1, the level shift unit 120 includes a switch MN2 and a switch MN3. For illustration, the switch MN2 is coupled to the switch MN3. The switch MN2 is controlled according to the supply voltage VDD1. The switch MN3 is controlled according to the operation voltage OUTH1. In operation, the switch MN3 is turned on according to a control of the operation voltage OUTH1, so as to transmit the supply voltage VDD1 as the output voltage OUT1 having the first level.

In some embodiments, the switches MN2 and MN3 are implemented by NMOSs. The switches MN2 and MN3 are crossed-coupled. For illustration, the switch MN2 has a drain coupled to the operation terminal X1, a gate configured to receive the supply voltage VDD1, and a source coupled to the output terminal Z1. The switch MN3 has a drain configured to receive the supply voltage VDD1, a gate coupled to the operation terminal X1, and a source coupled to the output terminal Z1. The configurations of the level shift unit 120 in aforementioned embodiments are given for illustrative purposes only. Various configurations of the level shift unit 120 are within the contemplated scope of the present disclosure. For example, in other embodiments, the level shift unit 120 includes more than two switches.

In some embodiments, as illustratively shown in FIG. 1, the level shift unit 130 includes a switch MP2 and a switch MP3. For illustration, the switch MP2 and the switch MP3 are coupled. The switch MP2 is controlled according to the supply voltage VDD2. The switch MP3 is controlled according to the operation voltage OUTL1. In operation, the switch MP3 is turned on according to a control of the operation voltage OUTL1, so as to transmit the supply voltage VDD2 as the output voltage OUT1 having the second level.

In some embodiments, the switches MP2 and MP3 are implemented by PMOSs. The switches MP2 and MP3 are crossed-coupled. For illustration, the switch MP2 has a source coupled to the output terminal Z1, a gate configured to receive the supply voltage VDD2, and a drain coupled to the operation terminal Y1. The switch MP3 has a source coupled to the output terminal Z1, a gate coupled to the operation terminal Y1, and a drain configured to receive the supply voltage VDD2. It is noted that the configurations of the level shift unit 130 in above embodiments are given for illustrative purposes only. Various configurations of the level shift unit 130 are within the contemplated scope of the present disclosure. For example, in other embodiments, the level shift unit 130 includes more than two switches.

In some embodiments, a withstand voltage of each switch MN1, MN2, MN3, MP1, MP2 or MP3 in the circuit 100 is 1×VDD. In other words, the circuit 100 is composed by a plurality of switches whose withstand voltage are 1×VDD.

Figure 2A:
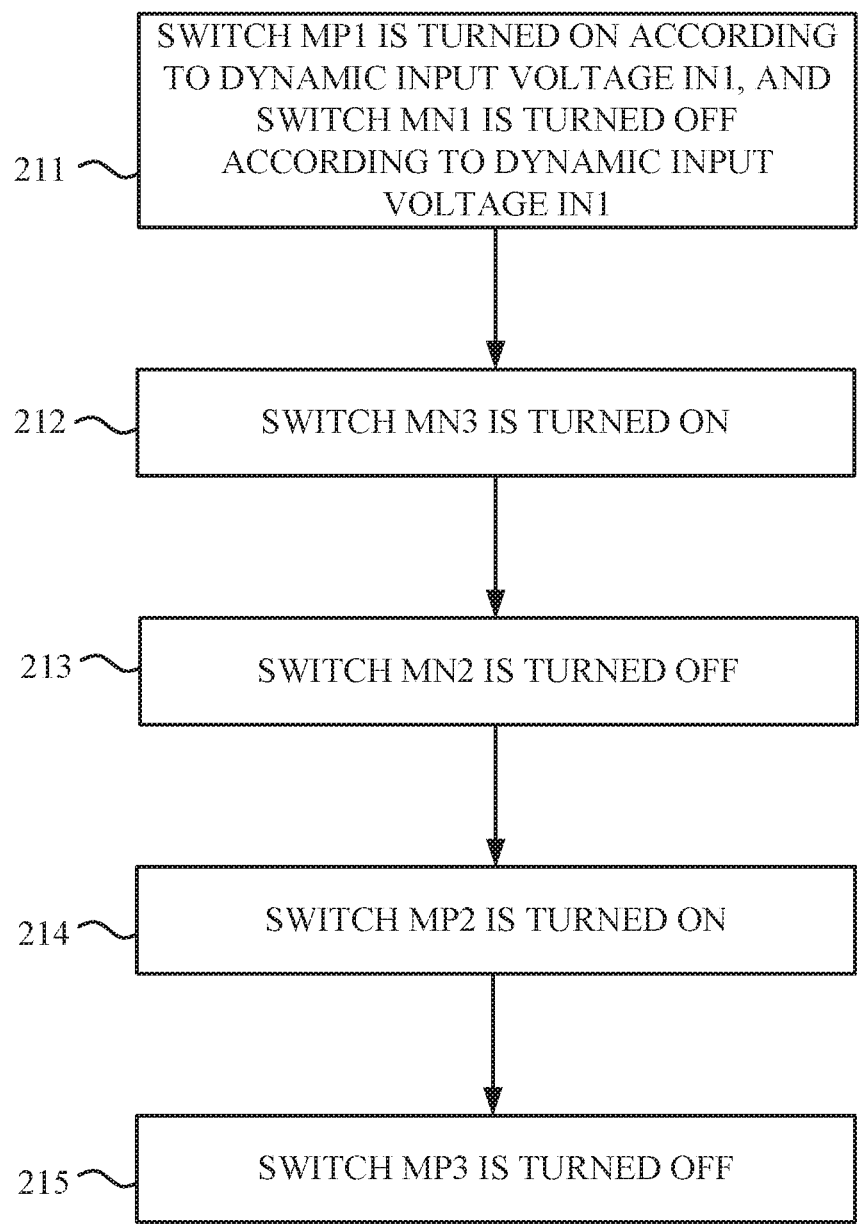
FIG. 2A is a flow chart of a method for shifting a voltage level by using the circuit in FIG. 1, in accordance with various embodiments of the present disclosure.

FIG. 2A is a flow chart of a method 200a for shifting a voltage level by using the circuit 100 in FIG. 1, in accordance with various embodiments of the present disclosure.

Figure 2B:
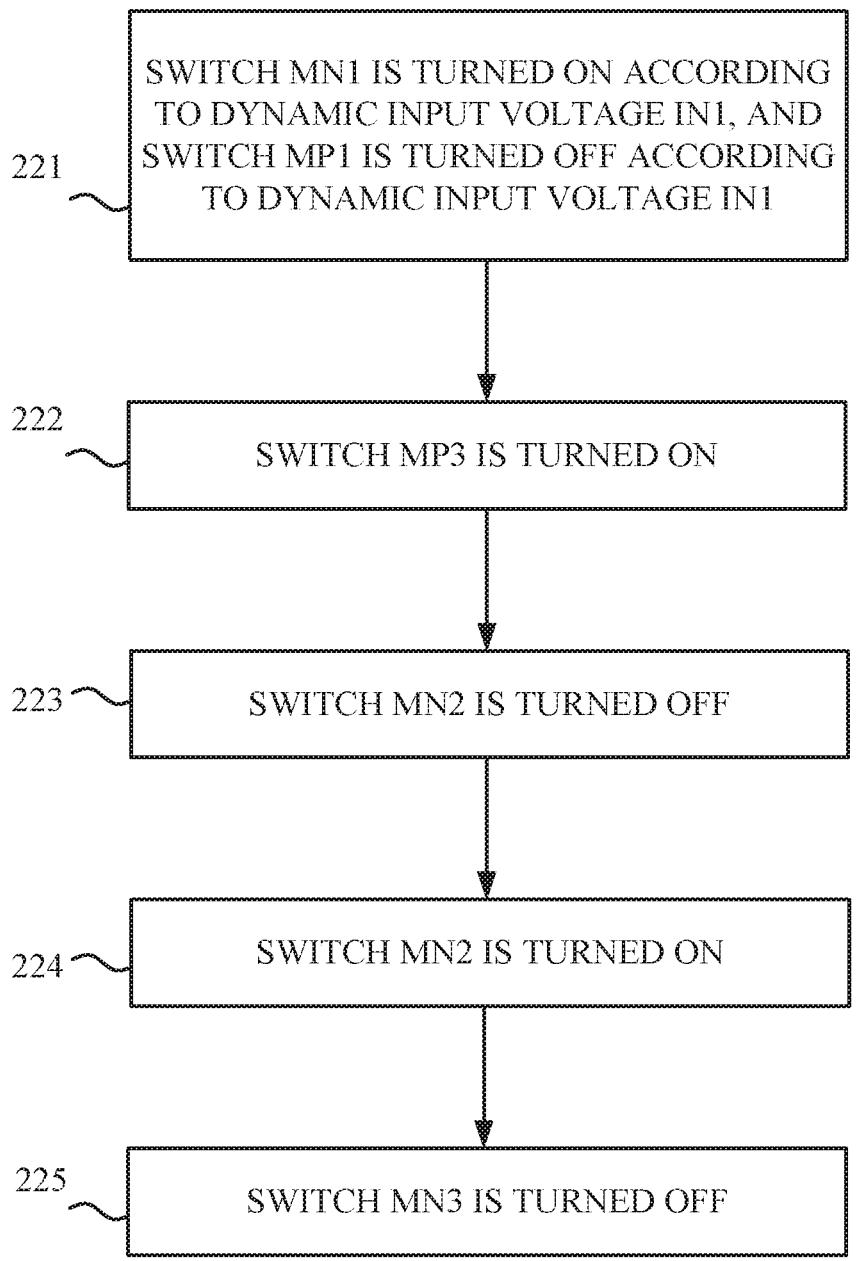
FIG. 2B is a flow chart of another method of shifting a voltage level by using the circuit in FIG. 1, in accordance with various embodiments of the present disclosure.
Figure 3:
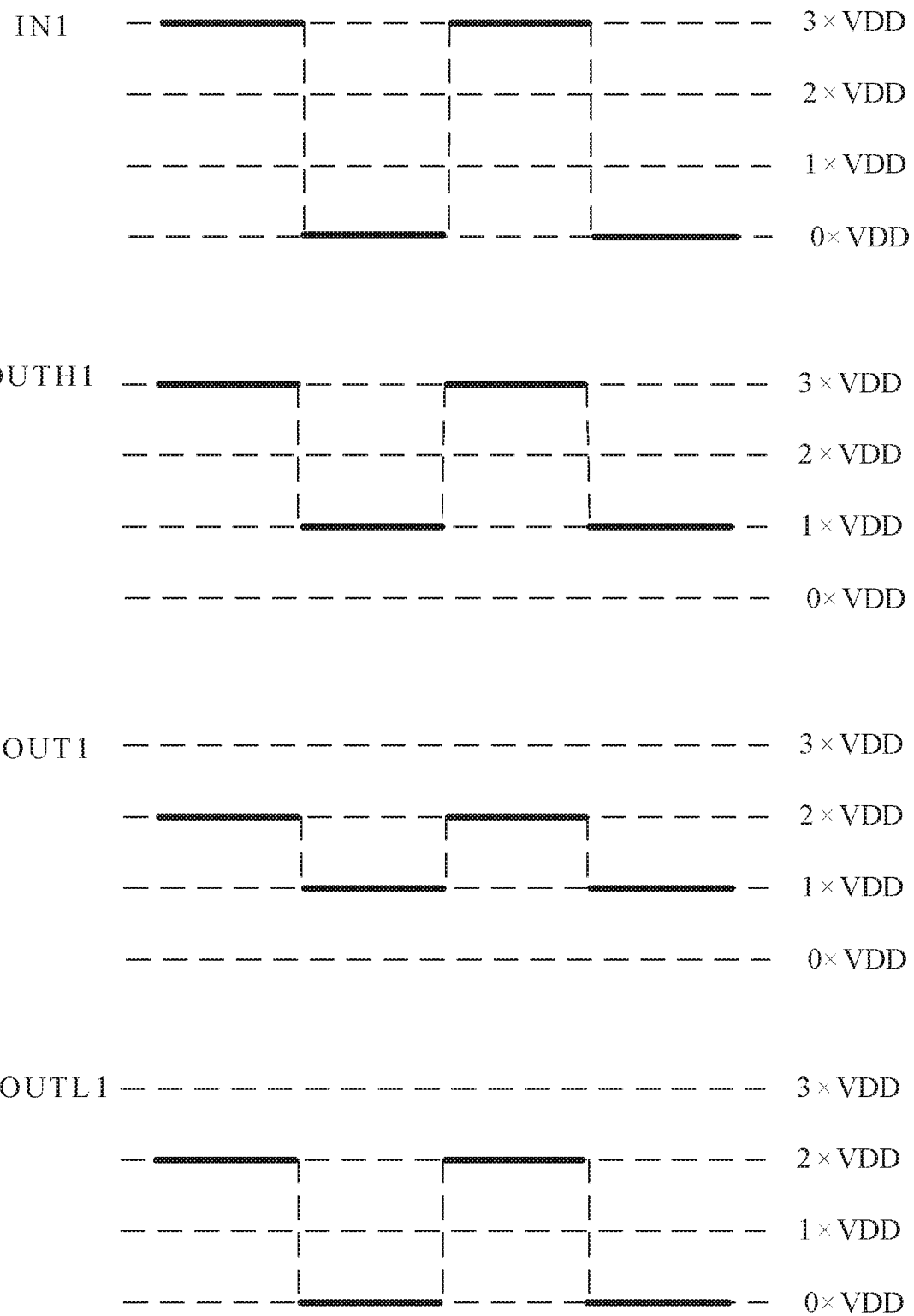
FIG. 3 is a schematic diagram illustrating voltage level shifting performed by the circuit in FIG. 1, in accordance with various embodiments of the present disclosure.

FIG. 2B is a flow chart of another method 200b of shifting a voltage level by using the circuit 100 in FIG. 1, in accordance with various embodiments of the present disclosure. FIG. 3 is a schematic diagram illustrating voltage level shifting performed by the circuit 100 in FIG. 1, in accordance with various embodiments of the present disclosure. An Operations of the circuit 100 in FIG. 1 are described below accompanying with FIG. 2A, FIG. 2B and FIG. 3.

For clear description and understanding, the supply voltage VDD1 is 2×VDD, the supply voltage VDD2 is 1×VDD and the dynamic input voltage IN1 is in a range from 0×VDD to 3×VDD for illustration.

It is noted that the method 200a in FIG. 2A is applied to the circuit 100 in FIG. 1 in a state where the dynamic input voltage IN1 has a voltage level of 3×VDD, and the method 200b in FIG. 2B is applied to the circuit 100 in FIG. 1 in a state where the dynamic input voltage IN1 has a voltage level of 0×VDD.

As illustratively shown in FIG. 2A, in operation 211, when the dynamic input voltage IN1 has the voltage level of 3×VDD, the switch MP1 is turned on according to the dynamic input voltage IN1 and the switch MN1 is turned off according to the dynamic input voltage IN1. When the switch MP1 is turned on, the dynamic input voltage IN1 is transmitted to the operation terminal X1 through the switch MP1, such that the operation voltage OUTH1 at the operation terminal X1 has the voltage level of 3×VDD. At this time, since the supply voltage VDD1 has a voltage level of 2×VDD, a voltage difference between the operation voltage OUTH1 at the operation terminal X1 and the supply voltage VDD1 is 1×VDD.

In operation 212, since the operation voltage OUTH1 has the voltage level of 3×VDD, the switch MN3 is turned on according to the operation voltage OUTH1. When the switch MN3 is turned on, the supply voltage VDD1 is transmitted to the output terminal Z1 through the switch MN3, such that the output voltage OUT1 at the output terminal Z1 has the voltage level of 2×VDD.

At this time, the drain of the switch MN3 has the voltage level of 2×VDD, the source of the switch MN3 has the voltage level of 2×VDD, and the gate of the switch MN3 has the voltage level of 3×VDD, and thus a voltage difference between any two terminals of the switch MN3 is 1×VDD or 0×VDD.

In operation 213, the drain of the switch MN2 has the voltage level of 3×VDD, the source of the switch MN2 has the voltage level of 2×VDD, and the gate of the switch MN2 has the voltage level of 2×VDD, and thus the switch MN2 is turned off and a voltage difference between any two terminals of the switch MN2 is 1×VDD or 0×VDD.

Moreover, since the output voltage OUT1 at the output terminal Z1 has the voltage level of 2×VDD, the gate of the switch MP1 has the voltage level of 2×VDD and the gate of the switch MN1 also has the voltage level of 2×VDD.

The dynamic input voltage IN1 has the voltage level of 3×VDD, the output voltage OUT1 at the output terminal Z1 has the voltage level of 2×VDD, and the operation voltage OUTH1 at the operation terminal X1 has the voltage level of 3×VDD, and thus a voltage difference between any two terminals of the switch MP1 is 1×VDD or 0×VDD.

The dynamic input voltage IN1 has the voltage level of 3×VDD and the output voltage OUT1 at the output terminal Z1 has the voltage level of 2×VDD, and thus the switch MN1 is still turned off.

In operation 214, since the output voltage OUT1 at the output terminal Z1 has the voltage level of 2×VDD and the supply voltage VDD2 has the voltage level of 1×VDD, the switch MP2 is turned on. When the switch MP2 is turned on, the output voltage OUT1 at the output terminal Z1 is transmitted to the operation terminal Y1 through the switch MP2, such that the operation voltage OUTL1 at the operation terminal Y1 has the voltage level of 2×VDD. At this time, since the supply voltage VDD2 has the voltage level of 1×VDD, a voltage difference between the operation voltage OUTL1 at the operation terminal Y1 and the supply voltage VDD2 is 1×VDD.

The source of the switch MP2 has the voltage level of 2×VDD, the drain of the switch MP2 has the voltage level of 2×VDD, and the gate of the switch MP2 has the voltage level of 1×VDD, and thus a voltage difference between any two terminals of the switch MP2 is 1×VDD or 0×VDD.

In operation 215, the drain of the switch MP3 has the voltage level of 1×VDD, the source of the switch MP3 has the voltage level of 2×VDD, and the gate of the switch MP3 has the voltage level of 2×VDD, and thus the switch MP3 is turned off and a voltage difference between any two terminals of the switch MP3 is 1×VDD or 0×VDD.

Moreover, the source of the switch MN1 has the voltage level of 3×VDD, the drain of the switch MN1 has the voltage level of 2×VDD, and the gate of the switch MN1 has the voltage level of 2×VDD, and thus a voltage difference between any two terminals of the switch MN1 is 1×VDD or 0×VDD.

As illustratively shown in FIG. 2B, in operation 221, when the dynamic input voltage IN1 has the voltage level of 0×VDD, the switch MN1 is turned on according to the dynamic input voltage IN1 and the switch MP1 is turned off according to the dynamic input voltage IN1. When the switch MN1 is turned on, the dynamic input voltage IN1 is transmitted to the operation terminal Y1 through the switch MN1, such that the operation voltage OUTL1 at the operation terminal Y1 has the voltage level of 0×VDD. At this time, since the supply voltage VDD2 has a voltage level of 1×VDD, a voltage difference between the operation voltage OUTL1 at the operation terminal Y1 and the supply voltage VDD2 is 1×VDD.

In operation 222, since the operation voltage OUTL1 at the operation terminal Y1 has the voltage level of 0×VDD, the switch MP3 is turned on according to the operation voltage OUTL1. When the switch MP3 is turned on, the supply voltage VDD2 is transmitted to the output terminal Z1 through the switch MP3, such that the output voltage OUT1 at the output terminal Z1 has the voltage level of 1×VDD.

The source of the switch MP3 has the voltage level of 1×VDD, the drain of the switch MP3 has the voltage level of 1×VDD, and the gate of the switch MP3 has the voltage level of 0×VDD, and thus a voltage difference between any two terminals of the switch MP3 is 1×VDD or 0×VDD.

In operation 223, the drain of the switch MP2 has the voltage level of 0×VDD, the source of the switch MP2 has the voltage level of 1×VDD, and the gate of the switch MP2 has the voltage level of 1×VDD, so the switch MP2 is turned off and a voltage difference between any two terminals of the switch MP2 is 1×VDD or 0×VDD.

Moreover, the output voltage OUT1 at the output terminal Z1 has the voltage level of 1×VDD, and thus the gate of the switch MP1 has the voltage level of 1×VDD and the gate of the switch MN1 also has the voltage level of 1×VDD.

The dynamic input voltage IN1 has the voltage level of 0×VDD, the output voltage OUT1 at the output terminal Z1 has the voltage level of 1×VDD and the operation voltage OUTL1 at the operation terminal Y1 has the voltage level of 0×VDD, and thus a voltage difference between any two terminals of the switch MN1 is 1×VDD or 0×VDD.

The dynamic input voltage IN1 has the voltage level of 0×VDD and the output voltage OUT1 at the output terminal Z1 has the voltage level of 1×VDD, the switch MP1 is still turned off.

At operation 224, the output voltage OUT1 at the output terminal Z1 has the voltage level of 1×VDD and the supply voltage VDD1 has the voltage level of 2×VDD, and thus the switch MN2 is turned on. When the switch MN2 is turned on, the output voltage OUT1 at the output terminal Z1 is transmitted to the operation terminal X1 through the switch MN2, such that the operation voltage OUTH1 at the operation terminal X1 has the voltage level of 1×VDD. At this time, since the supply voltage VDD1 has the voltage level of 2×VDD, a voltage difference between the operation voltage OUTH1 at the operation terminal X1 and the supply voltage VDD1 is 1×VDD.

The source of the switch MN2 has the voltage level of 1×VDD, the drain of the switch MN2 has the voltage level of 1×VDD and the gate of the switch MN2 has the voltage level of 2×VDD, and thus a voltage difference between any two terminals of the switch MN2 is 1×VDD or 0×VDD.

In operation 225, the drain of the switch MN3 has the voltage level of 2×VDD, the source of the switch MN3 has the voltage level of 1×VDD, and the gate of the switch MN3 has the voltage level of 1×VDD, and thus the switch MN3 is turned off and a voltage difference between any two terminals of the switch MN3 is 1×VDD or 0×VDD.

Moreover, the source of the switch MP1 has the voltage level of 0×VDD, the drain of the switch MP1 has the voltage level of 1×VDD and the gate of the switch MP1 has the voltage level of 1×VDD, and thus a voltage difference between any two terminals of the switch MP1 is 1×VDD or 0×VDD.

In the current technology of level shift circuit, when an input voltage exceeds 2×VDD, a cross voltage sustained by a switch element exceeds 1×VDD, and thus the switch element is easily damaged. However, from above description, a voltage difference between any two terminals of each switch of the circuit 100 is 1×VDD or 0×VDD. In other words, a cross voltage sustained by each switch of the circuit 100 is equal to or lower than a withstand voltage (1×VDD) of the switch, such that the switches of the circuit 100 are prevented from being damaged and a lifetime of the circuit 100 is lengthening.

The above illustrations include exemplary operations in sequence, but the operations are not necessarily performed in the order shown. Various orders of the operations are within the contemplated scope of the present disclosure. Moreover, operations may be added, replaced, changed order, and/or eliminated as appropriate, in accordance with the spirit and scope of various embodiments of the present disclosure.

In some embodiments, when the dynamic input voltage IN1 is in a range from 0×VDD to N×VDD and when N is greater than or equal to 3, the supply voltage VDD1 is in a range from 2×VDD to (N−1)×VDD and the supply voltage VDD2 is in a range from 1×VDD to (N−2)×VDD. Consequently, a cross voltage sustained by each switch is equal to or lower than a withstand voltage of the switch. For illustration, the supply voltage VDD1 is greater than the supply voltage VDD2, and a voltage difference between the supply voltage VDD1 and the supply voltage VDD2 is 1×VDD.

Figure 4:
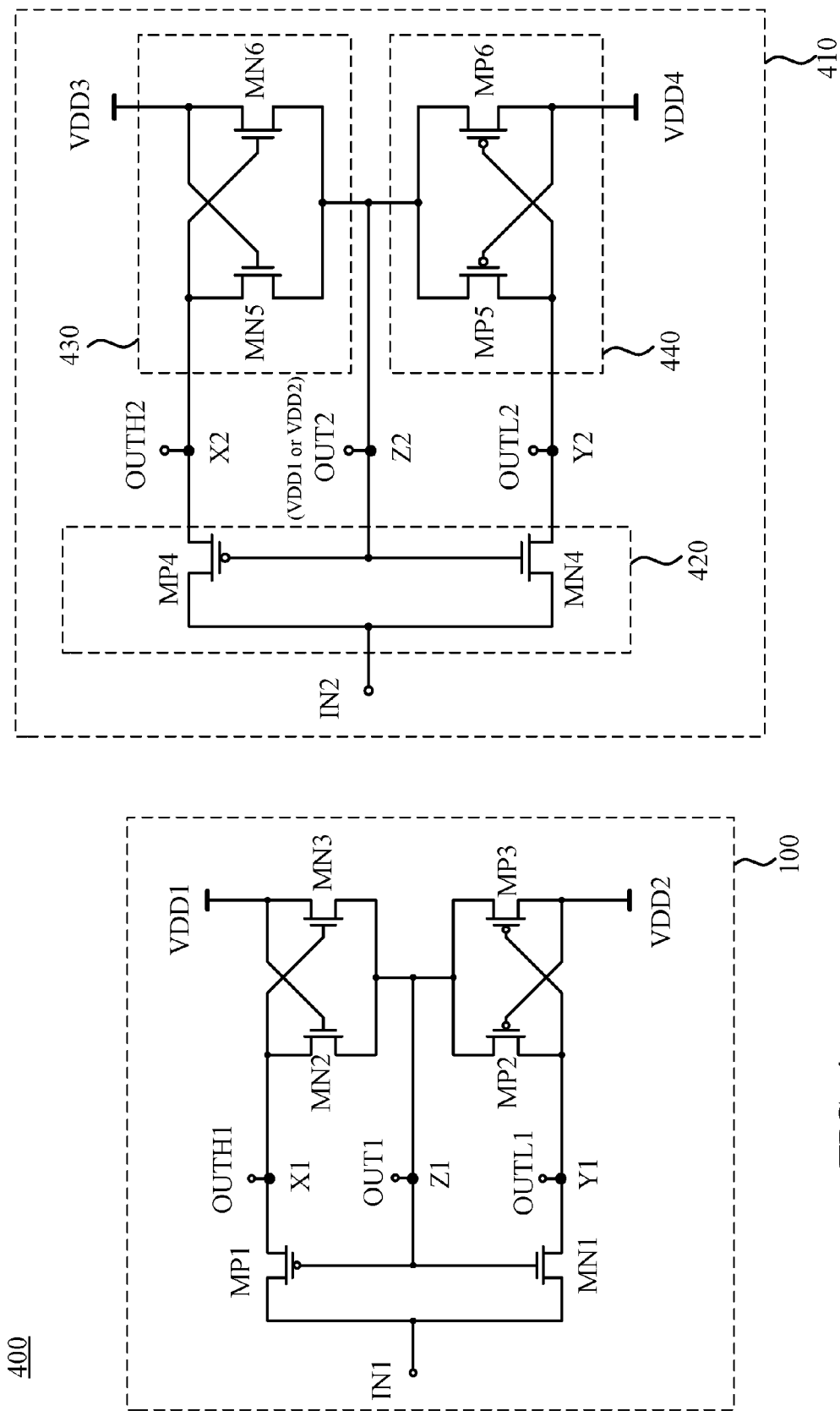
FIG. 4 is a circuit diagram of another circuit including the circuit in FIG. 1, in accordance with various embodiments of the present disclosure.

FIG. 4 is a circuit diagram of another circuit 400 including the circuit 100 in FIG. 1, in accordance with various embodiments of the present disclosure. For ease of understanding, with respect to the embodiments of FIG. 1, like elements in FIG. 4 are designated with the same reference numbers. The circuit 400 includes the circuit 100 and a circuit 410. In some embodiments, the circuit 400 is a level shift circuit, or applied in a level shift circuit. The circuit 410 is coupled to the circuit 100. For illustration, an output terminal Z2 of the circuit 410 is coupled to the drain of the switch MN3 or the drain of the switch MP3 of the circuit 100. In some embodiments, the circuit 410 is configured to generate an output voltage OUT2 as the supply voltage VDD1 or the supply voltage VDD2 of the circuit 100.

In some embodiments, as illustratively shown in FIG. 4, the circuit 410 includes a switch unit 420, a level shift unit 430 and a level shift unit 440. The switch unit 420 is similar to the switch unit 110. The level shift unit 430 is similar to the level shift unit 120. The level shift unit 440 is similar to the level shift unit 130.

The switch unit 420 is configured to receive a dynamic input voltage IN2, and to generate an operation voltage OUTH2 at an output terminal X2 or an operation voltage OUTL2 at an output terminal Y2 according to the dynamic input voltage IN2.

The level shift unit 430 is coupled to the switch unit 420 at the operation terminal X2. The level shift unit 430 is configured to shift the operation voltage OUTH2 at the operation terminal X2 to an output voltage OUT2 according to a supply voltage VDD3. The output voltage OUT2 has a first level and is outputted at the output terminal Z2, such that the output voltage OUT2 is used as the supply voltage VDD1 of the circuit 100 or the supply voltage VDD2 of the circuit 100.

The level shift unit 440 is coupled to the switch unit 420 at the operation terminal Y2. The level shift unit 440 is configured to shift the operation voltage OUTL2 at the operation terminal Y2 to an output voltage OUT2 according to a supply voltage VDD4. The output voltage OUT2 has a second level and is outputted at the output terminal Z2, such that the output voltage OUT2 is used as the supply voltage VDD1 of the circuit 100 or the supply voltage VDD2 of the circuit 100.

The switch unit 420 includes a switch MP4 and a switch MN4. The level shift unit 430 includes a switch MN5 and a switch MN6. The level shift unit 440 includes a switch MP5 and a switch MP6. In some embodiments, the switch MP4, the switch MP5 and the switch MP6 are implemented with PMOSs. The switch MN4, the switch MN5 and the switch MN6 are implemented with NMOSs.

The configuration of the switch unit 420 in FIG. 4 is given for illustrative purposes only. Various configurations of the switch unit 420 are within the contemplated scope of the present disclosure. For example, in other embodiments, the switch unit 420 includes more than two switches.

The configuration of the level shift unit 430 in FIG. 4 is given for illustrative purposes only. Various configurations of the level shift unit 430 are within the contemplated scope of the present disclosure. For example, in other embodiments, the level shift unit 430 includes more than two switches.

The configuration of the level shift unit 440 in FIG. 4 is given for illustrative purposes only. Various configurations configured to implement the level shift unit 440 are within the contemplated scope of the present disclosure. For example, in other embodiments, the level shift unit 440 includes more than two switches.

The operation of the circuit 410 is similar to that of the circuit 100, and thus a detail description in this regard will not be provided here again.

The configuration of the circuit 400 in FIG. 4 is given for illustrative purposes only. Various configurations configured to implement the circuit 400 are within the contemplated scope of the present disclosure. For example, in other embodiments, the circuit 400 includes the circuit 100 and two circuits 410. One of the circuits 410 is configured to generate the supply voltage VDD1 of the circuit 100, and another of the circuits 410 is configured to generate the supply voltage VDD2 of the circuit 100.

In some embodiments, the supply voltage VDD1 and the supply voltage VDD2 of the circuit 100 are dynamic supply voltages. For illustration, when the voltage level of the dynamic input voltage IN1 is in a range from 0×VDD to 4×VDD, the supply voltage VDD1 is in a range from 2×VDD to 3×VDD, and the supply voltage VDD2 is in a range from 1×VDD to 2×VDD.

If the output voltage OUT2 at the output terminal Z2 is configured to be the supply voltage VDD1, a voltage level of the dynamic input voltage IN2 is in a range from 1×VDD to 4×VDD, a voltage level of the supply voltage VDD3 is 3×VDD, and a voltage level of the supply voltage VDD4 is 2×VDD. Consequently, a voltage level of the output voltage OUT2 at the output terminal Z2 is in a range from 2×VDD to 3×VDD.

If the output voltage OUT2 at the output terminal Z2 is configured to be the supply voltage VDD2, the voltage level of the dynamic input voltage IN2 is in a range from 0×VDD to 3×VDD, the voltage level of the supply voltage VDD3 is 2×VDD, and the voltage level of the supply voltage VDD4 is 1×VDD, such that the output voltage OUT2 at the output terminal Z2 is in a range from 1×VDD to 2×VDD.

From the aforementioned embodiments, the supply voltage VDD1 of the circuit 100 and the supply voltage VDD2 of the circuit 100 are respectively generated by two circuits 410. In the same way, the supply voltage VDD3 of the circuit 410 and the supply voltage VDD4 of the circuit 410 are respectively generated by other two circuits, and so on.

Since the circuit 410 and the circuit 100 have the same operation principle, a voltage difference between any two terminals of each switch of the circuit 410 is 1×VDD or 0×VDD. In other words, a voltage difference between any two terminals of each switch of the circuit 400 is 1×VDD or 0×VDD.

From above embodiments, the circuit 100 or the circuit 400 is implemented to enable a cross voltage sustained by each switch of the circuit 100 or the circuit 400 is equal to or lower than a withstand voltage (1×VDD) of the switch. Consequently, each switch is prevented from being damaged due to a large cross voltage.

Figure 5:
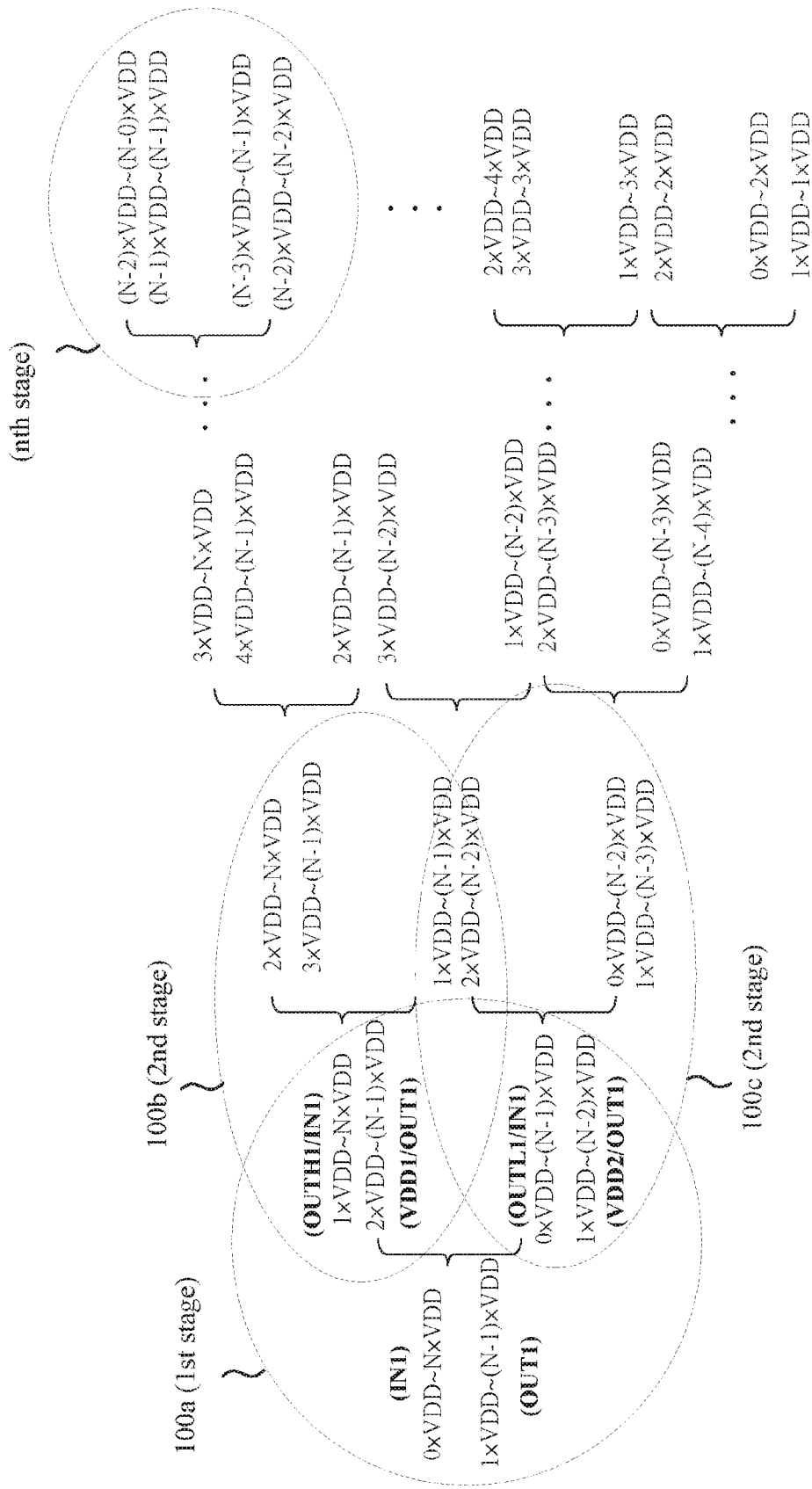
FIG. 5 is a schematic diagram illustrating a circuit including plural stages of sub circuits that are each implemented by a circuit like the circuit in FIG. 1, in accordance with some embodiments of the present disclosure.

FIG. 5 is a schematic diagram illustrating a circuit including plural stages of sub circuits that are each implemented by a circuit like the circuit 100 in FIG. 1, in accordance with some embodiments of the present disclosure. For convenience of illustration, each sub circuit in each one stage is indicated by one circle, as illustrated in FIG. 5. For simplicity, only a few circles are shown and labeled in FIG. 5.

For illustration, the circuit includes n stages as shown in FIG. 5. The 1st stage includes a sub circuit 100*a*. The 2nd stage includes two sub circuits 100*b* and 100*c*. The 3rd stage includes three sub circuits (not labeled). The rest of stages are deduced by analogy. A configuration of each of the sub circuits is the same as the configuration of the circuit 100 in FIG. 1. In other words, like the circuit 100 in FIG. 1, each of the sub circuits 100*a*, 100*b* and 100*c* is implemented with the dynamic input voltage IN1, the output voltage OUT1, the operation voltage OUTH1, the supply voltage VDD1, the operation voltage OUTL1, and the supply voltage VDD2. Explained in a different way, each one of the sub circuits indicated by one circle in FIG. 5 is implemented with six different voltages IN1, OUT1, OUTH1, VDD1, OUTL1, and VDD2, as shown in FIG. 5.

For illustration of the sub circuit 100a, the supply voltage VDD1 of the sub circuit 100a is configured from the output voltage OUT1 of the sub circuit 100b, and the supply voltage VDD2 of the sub circuit 100a is configured from the output voltage OUT1 of the sub circuit 100c. Moreover, the operation voltage OUTH1 is generated as the dynamic input voltage IN1 of the sub circuit 100b, and the operation voltage OUTL1 is generated as the dynamic input voltage IN1 of the sub circuit 100c. Voltage configurations of the other sub circuits are deduced by analogy, and thus for simplicity, they are not further detailed herein.

In some embodiments, the dynamic input voltage IN1 of the sub circuit 100a is in a range from M×VDD to N×VDD. M is equal to 0 or a positive integer, and N is equal to or larger than 3, in some embodiments. In such embodiments, the supply voltage VDD1 of the sub circuit 100a is in a range from (M+2)×VDD to (N−1)×VDD, and the supply voltage VDD2 of the sub circuit 100a is in a range from (M+1)×VDD to (N−2)×VDD. Accordingly, the dynamic input voltage IN1 of the sub circuit 100b is in a range from (M+1)×VDD to N×VDD, the supply voltage VDD1 of the sub circuit 100b is in a range from (M+3)×VDD to (N−1)×VDD, and the supply voltage VDD2 of the sub circuit 100b is in a range from (M+2)×VDD to (N−2)×VDD. Accordingly, the dynamic input voltage IN1 of the sub circuit 100c is in a range from M×VDD to (N−1)×VDD, the supply voltage VDD1 of the sub circuit 100c is in a range from (M+2)×VDD to (N−2)×VDD, and the supply voltage VDD2 of the sub circuit 100c is in a range from (M+1)×VDD to (N−3)×VDD.

In various embodiments, the dynamic input voltage IN1 of the sub circuit 100a is in a range from 0×VDD to N×VDD. Based on the discussion with reference to FIG. 1, FIG. 3 and FIG. 4, when the dynamic input voltage IN1 is in the range from 0×VDD to N×VDD, the supply voltage VDD1 of the sub circuit 100a is a range from 2×VDD to (N−1)×VDD, and the supply voltage VDD2 of the sub circuit 100a is a range from 1×VDD to (N−2)×VDD. Accordingly, the operation voltage OUTH1 of the sub circuit 100a is in a range from 1×VDD to N×VDD which is also configured as the dynamic input voltage IN1 of the sub circuit 100b, and the operation voltage OUTL1 of the sub circuit 100a is in a range from 0×VDD to (N−1)×VDD which is also configured as the dynamic input voltage IN1 of the sub circuit 100c. The output voltage OUT1 of the sub circuit 100a is in a range from 1×VDD to (N−1)×VDD accordingly.

Voltages implemented in the other sub circuits, including the sub circuits 100b and 100c, are configured corresponding to those in the sub circuit 100a as discussed above, and are shown in FIG. 5. For simplicity, they are not further detailed herein.

Based on the discussion above, the circuit having n stages in FIG. 5 is also able to be implemented to enable a cross voltage, sustained by each switch of each sub circuit, to be equal to or lower than a withstand voltage (1×VDD) of the switch. Consequently, each switch is prevented from being damaged due to a large cross voltage.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a circuit is disclosed that includes a first switch unit, a first level shift unit and a second level shift unit. The first switch unit is configured to receive a first dynamic input voltage, and to generate a first operation voltage at a first operation terminal or generate a second operation voltage at a second operation terminal according to the first dynamic input voltage. The first level shift unit is coupled to the first switch unit at the first operation terminal, and is configured to shift the first operation voltage to a first output voltage having a first level at an output terminal according to a first supply voltage. The second level shift unit is coupled to the first switch unit at the second operation terminal, and is configured to shift the second operation voltage to the first output voltage having a second level according to a second supply voltage.

Also disclosed is a circuit that includes a first switch, a second switch, a third switch, a fourth switch, a fifth switch and a sixth switch. A first terminal of the first switch and a first terminal of the second switch are configured to receive a first dynamic input voltage ranging from M×VDD to N×VDD. A first terminal of the third switch and a control terminal of the fourth switch are coupled to a second terminal of the first switch. A control terminal of the third switch and a first terminal of the fourth switch are configured to receive a first supply voltage ranging from (M+2)×VDD to (N−1)×VDD. A second terminal of the third switch and a second terminal of the fourth switch are coupled to a control terminal of the first switch and a control terminal of the second switch respectively. A first terminal of the fifth switch and a control terminal of the sixth switch are coupled to a second terminal of the second switch. A control terminal of the fifth switch and a first terminal of the sixth switch are configured to receive a second supply voltage ranging from (M+1)×VDD to (N−2)×VDD. A second terminal of the fifth switch and a second terminal of the sixth switch are coupled to the control terminal of the first switch and the control terminal of the second switch respectively. VDD is substantially equal to a withstand voltage of each one of the first switch, the second switch, the third switch, the fourth switch, the fifth switch and the sixth switch. M is equal to 0 or a positive integer, and N is equal to or larger than 3.

Also disclosed is a method that includes the operation below. A first operation voltage is generated at a first operation terminal or a second operation voltage is generated at a second operation terminal by a first switch unit according to a first dynamic input voltage. The first operation voltage is shifted to a first output voltage having a first level at an output terminal by a first level shift unit according to a first supply voltage. The second operation voltage is shifted to the first output voltage having a second level by a second level shift unit according to a second supply voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first switch unit configured to receive a first dynamic input voltage, and to generate a first operation voltage at a first operation terminal or generate a second operation voltage at a second operation terminal according to the first dynamic input voltage and a first output voltage that is transmitted to the first switch unit;
a first level shift unit coupled to the first switch unit at the first operation terminal, and configured to shift the first operation voltage to the first output voltage having a first level at an output terminal according to a first supply voltage; and
a second level shift unit coupled to the first switch unit at the second operation terminal, and configured to shift the second operation voltage to the first output voltage having a second level according to a second supply voltage.

2. The circuit of claim 1, wherein the first level shift unit comprises:
at least one switch configured to be controlled by the first operation voltage to transmit the first supply voltage as the first output voltage having the first level.

3. The circuit of claim 1, wherein the second level shift unit comprises:
at least one switch configured to be controlled by the second operation voltage to transmit the second supply voltage as the first output voltage having the second level.

4. The circuit of claim 1, wherein the first switch unit comprises:
a first switch configured to be turned on in a state where the first dynamic input voltage has a first level, to transmit the first dynamic input voltage having the first level as the first operation voltage; and
a second switch configured to be turned on in a state where the first dynamic input voltage has a second level, to transmit the first dynamic input voltage having the second level as the second operation voltage.

5. The circuit of claim 1, wherein the first level shift unit comprises:
two cross-coupled switches, wherein control terminals of the two cross-coupled switches are configured to receive the first supply voltage and the first operation voltage respectively, first terminals of the two cross-coupled switches are configured to receive the first operation voltage and the first supply voltage respectively, and second terminals of the two cross-coupled switches are coupled to the output terminal.

6. The circuit of claim 5, wherein the first switch unit comprises:
at least one switch, wherein a control terminal of the at least one switch is coupled to the output terminal, a first terminal of the at least one switch is configured to receive the first dynamic input voltage, and a second terminal of the at least one switch and the two cross-coupled switches of the first level shift unit are coupled at the first operation terminal.

7. The circuit of claim 1, wherein the second level shift unit comprises:
two cross-coupled switches, wherein control terminals of the two cross-coupled switches are configured to receive the second supply voltage and the second operation voltage respectively, first terminals of the two cross-coupled switches are configured to receive the second operation voltage and the second supply voltage respectively, and second terminals of the two cross-coupled switches are coupled to the output terminal.

8. The circuit of claim 7, wherein the first switch unit comprises:
at least one switch, wherein a control terminal of the at least one switch is coupled to the output terminal, a first terminal of the at least one switch is configured to receive the first dynamic input voltage, and a second terminal of the at least one switch and the two cross-coupled switches of the second level shift unit are coupled at the second operation terminal.

9. The circuit of claim 1, further comprising:
a second switch unit configured to receive a second dynamic input voltage, and to generate a third operation voltage at a third operation terminal or generate a fourth operation voltage at a fourth operation terminal according to the second dynamic input voltage;
a third level shift unit coupled to the second switch unit at the third operation terminal, and configured to shift the third operation voltage to a second output voltage having a first level according to a third supply voltage; and
a fourth level shift unit coupled to the second switch unit at the fourth operation terminal, and configured to shift the fourth operation voltage to the second output voltage having a second level according to a fourth supply voltage,
wherein
in a condition that the second output voltage is configured to be the first supply voltage, the third level shift unit and the fourth level shift unit are coupled to the first level shift unit, and
in a condition that the second output voltage is configured to be the second supply voltage, the third level shift unit and the fourth level shift unit are coupled to the second level shift unit.

10. The circuit of claim 1, wherein a voltage difference between the first operation voltage and the first supply voltage is substantially equal to a withstand voltage of at least one switch of the first level shift unit, and/or a voltage difference between the second operation voltage and the second supply voltage is substantially equal to a withstand voltage of at least one switch of the second level shift unit.

11. A circuit, comprising:
a first switch and a second switch, wherein a first terminal of the first switch and a first terminal of the second switch are configured to receive a first dynamic input voltage ranging from M×VDD to N×VDD;
a third switch and a fourth switch, wherein a first terminal of the third switch and a control terminal of the fourth switch are coupled to a second terminal of the first switch, a control terminal of the third switch and a first terminal of the fourth switch are configured to receive a first supply voltage ranging from (M+2)×VDD to (N−1)×VDD, and a second terminal of the third switch and a second terminal of the fourth switch are coupled to a control terminal of the first switch and a control terminal of the second switch respectively; and
a fifth switch and a sixth switch, wherein a first terminal of the fifth switch and a control terminal of the sixth switch are coupled to a second terminal of the second switch, a control terminal of the fifth switch and a first terminal of the sixth switch are configured to receive a second supply voltage ranging from (M+1)×VDD to (N−2)×VDD, and a second terminal of the fifth switch and a second terminal of the sixth switch are coupled to the control terminal of the first switch and the control terminal of the second switch respectively;

wherein VDD is substantially equal to a withstand voltage of each one of the first switch, the second switch, the third switch, the fourth switch, the fifth switch and the sixth switch, M is equal to 0 or a positive integer, and N is equal to or larger than 3.

12. The circuit of claim 11, further comprising:

a seventh switch and an eighth switch, wherein a first terminal of the seventh switch and a first terminal of the eighth switch are configured to receive a second dynamic input voltage ranging from (M+1)×VDD to N×VDD or ranging from M×VDD to (N−1)×VDD;

a ninth switch and a tenth switch, wherein a first terminal of the ninth switch and a control terminal of the tenth switch are coupled to a second terminal of the seventh switch, a control terminal of the ninth switch and a first terminal of the tenth switch are configured to receive a third supply voltage ranging from (M+3)×VDD to (N−1)×VDD or ranging from (M+2)×VDD to (N−2)×VDD, and a second terminal of the ninth switch and a second terminal of the tenth switch are coupled to a control terminal of the seventh switch and a control terminal of the eighth switch; and an eleventh switch and a twelfth switch, wherein a first terminal of the eleventh switch and a control terminal of the twelfth switch are coupled to a second terminal of the eighth switch, a control terminal of the eleventh switch and a first terminal of the twelfth switch are configured to receive a fourth supply voltage ranging from (M+2)×VDD to (N−2)×VDD or ranging from (M+1)×VDD to (N−3)×VDD, and a second terminal of the eleventh switch and a second terminal of the twelfth switch are coupled to the control terminal of the seventh switch and the control terminal of the eighth switch.

13. The circuit of claim 12, wherein the seventh switch, the eleventh switch and the twelfth switch are first-type switches, and the eighth switch, the ninth switch and the tenth switch are second-type switches which are complementary to the first-type switches.

14. The circuit of claim 11, wherein the first switch is a first-type switch, and the second switch is a second-type switch which is complementary to the first-type switch.

15. The circuit of claim 11, wherein the third switch and the fourth switch are first-type switches, and the fifth switch and the sixth switch are second-type switches which are complementary to the first-type switches.

16. The circuit of claim 11, wherein the first switch, the fifth switch and the sixth switch are P-type semiconductor switches, and the second switch, the third switch and the fourth switch are N-type semiconductor switches.

17. A method, comprising:

generating a first operation voltage at a first operation terminal or generating a second operation voltage at a second operation terminal by a first switch unit according to a first dynamic input voltage and a first output voltage that is transmitted to the first switch unit;

shifting the first operation voltage to the first output voltage having a first level at an output terminal by a first level shift unit according to a first supply voltage; and shifting the second operation voltage to the first output voltage having a second level by a second level shift unit according to a second supply voltage.

18. The method of claim 17, wherein shifting the first operation voltage to the first output voltage comprises:

transmitting the first supply voltage to the first output voltage having the first level by at least one switch of the first level shift unit which is controlled by the first operation voltage.

19. The method of claim 17, wherein shifting the second operation voltage to the first output voltage comprises:

transmitting the second supply voltage as the first output voltage having the second level by at least one switch of the second level shift unit which is controlled by the second operation voltage.

20. The method of claim 17, further comprising:

generating a third operation voltage at a third operation terminal or generating a fourth operation voltage at a fourth operation terminal by a second switch unit according to a second dynamic input voltage;

shifting the third operation voltage to a second output voltage having a first level by a third level shift unit coupled to the second switch unit at the third operation terminal according to a third supply voltage; and shifting the fourth operation voltage to the second output voltage having a second level by a fourth level shift unit coupled to the second switch unit at the fourth operation terminal according to a fourth supply voltage, wherein in a condition that the second output voltage is configured to be the first supply voltage, the third level shift unit and the fourth level shift unit are coupled to the first level shift unit, in a condition that the second output voltage is configured to be the second supply voltage, the third level shift unit and the fourth level shift unit are coupled to the second level shift unit, and the first level shift unit is coupled to the first switch unit at the first operation terminal, and the second level shift unit is coupled to the first switch unit at the second operation terminal.

* * * * *